United States Patent
Zaytsev et al.

(10) Patent No.: US 9,294,128 B2
(45) Date of Patent: Mar. 22, 2016

(54) TEST SIGNAL GENERATOR FOR LOW-DENSITY PARITY-CHECK DECODER

(71) Applicant: LSI Corporation, San Jose, CA (US)

(72) Inventors: Denis Vladimirovich Zaytsev, Dzerzhinsky (RU); Ivan Leonidovich Mazurenko, Khimki (RU); Alexander Alexandrovich Petyushko, Bryansk (RU); Aleksey Alexandrovich Letunovskiy, Moscow (RU); Pavel Aleksandrovich Aliseitchik, Moscow (RU); Dmitry Nicolaevich Babin, Moscow (RU)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 13 days.

(21) Appl. No.: 14/027,371

(22) Filed: Sep. 16, 2013

(65) Prior Publication Data

US 2014/0245086 A1 Aug. 28, 2014

(30) Foreign Application Priority Data

Feb. 27, 2013 (RU) .................................. 2013108893

(51) Int. Cl.
*H03M 13/13* (2006.01)
*H03M 13/11* (2006.01)
*H03M 13/01* (2006.01)

(52) U.S. Cl.
CPC ........ *H03M 13/1102* (2013.01); *H03M 13/015* (2013.01); *H03M 13/1142* (2013.01)

(58) Field of Classification Search
CPC .......... H03M 13/1148; H03M 13/255; H03M 13/13; H03M 13/1105; H03M 13/2939; H03M 13/015; H03M 13/1142; H04L 1/0057
USPC ......................................... 714/703, 704, 795
See application file for complete search history.

(56) References Cited

U.S. PATENT DOCUMENTS

| | | | |
|---|---|---|---|
| 7,647,366 B2 * | 1/2010 | Meintrup et al. | 708/250 |
| 8,037,393 B2 * | 10/2011 | Djurdjevic et al. | 714/780 |
| 2011/0149773 A1 * | 6/2011 | Lee et al. | 370/252 |

OTHER PUBLICATIONS

Aziz, Tariq, et al., "Performance Optimization of LDPC Codes Using Selective Coding Approach and Beacon Parity Check Matrix"; IEEE, 2010, 5 pages.

* cited by examiner

*Primary Examiner* — Phung M Chung

(57) ABSTRACT

A method for estimating error rates in low-density parity check codes includes calibrating an encoder according to specific channel parameters and according to dominant error events in the low-density parity-check code. Dominant codewords are classified based on characteristics of each codeword that are likely to produce similar error rates at similar noise levels; codeword classes that produce the highest error rate are then tested. Error boundary distance is estimated using multiple binary searches on segments. Segments are defined based on codeword, trapping set and biasing noise components of the channel. To improve calculation speed the most significant subclasses of codewords, trapping sets and noise signals are used.

20 Claims, 7 Drawing Sheets

TEST SIGNAL GENERATOR FOR LOW-DENSITY PARITY-CHECK DECODER

PRIORITY

The present application claims the benefit under 35 U.S.C. §119(a) of Russian Patent Application Serial Number 2013108893, filed Feb. 27, 2013, which is incorporated herein by reference.

BACKGROUND OF THE INVENTION

Read channel errors due to noise are rare. Estimating error probability at low noise levels involves selecting dominant error events (dominant trapping sets) and creating a reduced set of input test signals related to those trapping sets to reduce simulation time.

Low-density parity-check codes are linear codes with a sparse parity-check matrix. Sparse here means that the number of non-zero elements is a linear function of the size of the codewords.

It is known that decoding a low-density parity-check code on the binary symmetric channel is an NP-complete problem. So in order to ensure fast (linear) decoding, different techniques based on iterative belief propagation are used and give good approximations. But on the output of such iterative methods we can have words that are not codeword (because of the nature of belief propagation, the level of noise and so on), but some other word.

An output of such iterative methods which doesn't coincide with the original codeword may still be a valid codeword. This is a very bad situation for the decoder because the decoder does not have the ability to identify the valid but erroneous word. Hereafter such a situation will be called a miscorrection.

There exists a well-known technique called importance sampling, which is the modification of a Monte-Carlo method for the region which has the biggest error probability. One of the applications of the importance sampling method for finding low error rates (having the small level of noise) is the Cole method presented in a paper by Cole et al (a general method for finding low error rates of low-density parity-check codes) hereby incorporated by reference. The Cole method deals with so-called trapping sets (or near codewords), i.e. Some words, which are not codewords but can be converted to codewords with small effort, and leading to errors in case of small levels of noise. A trapping set is a set of variable nodes that produce a sub-graph of the tanner graph having special properties that cause error conditions in the decoder. Trapping sets depend on the decoder's parity check matrix, and on the decoding algorithm, and are mostly unknown for real-life decoders until determined experimentally.

The Cole method is a generalized method for finding low error rate low-density parity-check codes. The first step of the Cole method performs a search for potentially problematic trapping sets. The second step of the Cole method is used to select dominant (i.e. having more impact on probability of error) trapping sets from a list obtained in the first step. Considering a segment in a graph with the codeword on the left terminus and a given trapping set on the right terminus; movement along the segment is controlled by varying the amplitude of specially injected noise. The second step of the Cole method finds a critical noise level (resulted in squared error boundary distance) using a binary search along the segment. At a particular noise level, the critical noise level is moved to the right if the codeword is correctly decoded and to the left if the codeword is decoded as the trapping set. So, if the amplitude of the noise is greater than the critical level then the decoder gets the trapping set with a fairly high probability. The importance of the given trapping set for an original codeword corresponds to the distance from the original code word to a critical point on the segment. The third step runs importance sampling simulations by estimating error probability density functions for each trapping set when injecting noise of a certain level in a direction towards the trapping set; integrating the probability density over all injection levels; and summing up all integral probabilities taking trapping set multiplicity coefficients into account.

The Cole method is formulated for use in additive white Gaussian noise channels. In additive white Gaussian noise channels the resulting error boundary distance does not depend on the original codeword located at the left point of the corresponding segment: instead, we can consider any valid codeword that satisfies the linearity requirement on the left and the product of an exclusive disjunction operation of the codeword and trapping set on the right. This can be explained by variable independence in Gaussian noise channel and linear properties of low-density parity-check code.

Unlike additive white Gaussian noise channel there exist a variety of other channel types with ISI (inter symbol interference) like PR (partial response) or jitter channels. For these channels the second step of the Cole method will give significantly different estimations of error boundary distance for different random codewords. These non-stationary features of such channels require considering a set of randomly chosen original codewords. For this type of channel, even traditional importance sampling technique is ineffective because the number of simulations needed to get reliable error rate estimations is increased by several orders of magnitude as compared to average error rate results over different random input sectors. Furthermore, in real life, noise channels are usually data dependent.

The error floor phenomenon is related to all iterative decoding of low-density parity-check codes. It was discovered that the error floors under message-passing iterative decoding are usually due to low-weight trapping sets rather than low-weight codewords. Another (more rare) type of errors is related to miscorrection events mentioned above. For data-dependent noise channels we have discovered that there are classes of codewords that provoke additional errors of the decoder. Selecting such a "dominant" codeword class increase the error rate more significantly than selecting a dominant trapping set class.

Estimating probability of error could be made by running a direct simulation. But considering the real levels of error for high signal-to-noise ratios in modern hard disk drives, there is no possibility to get a real error probability estimation in a reasonable time.

Consequently, it would be advantageous if an apparatus existed that is suitable for estimating error probability of given low-density parity-check codes in a particular channel model.

SUMMARY OF THE INVENTION

Accordingly, the present invention is directed to a novel method and apparatus for estimating error probability of given low-density parity-check codes in a particular channel model.

In at least one embodiment of the present invention, codewords are divided into classes where the codewords in each class produce approximately the same number of errors for a given noise channel model. A class of codewords is selected to produce the highest error rates and simulations are run on a representative set of test waveforms from each codeword class until enough simulated errors are produced to estimate a probability of error. The overall error probability can then be estimated by factoring in conditional probability of random code words belonging to each of the dominant codeword classes. The conditional probability of random codewords belonging to a dominant codeword class can be estimated in advance based on combinatorial considerations.

In another embodiment of the present invention, an encoder is calibrated according to channel parameters and low-density parity-check code characteristics. Calibration based on a set of simulated results allows the encoder to focus on noise models most likely to produce error events.

In another embodiment of the present invention, an error boundary distance is estimated by binary search. A segment is defined by maximum and minimum noise values. Simulations are then run to find the minimum noise value likely to produce an error event by selecting a noise level along the segment using a binary search methodology.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the subject matter disclosed, which is illustrated in the accompanying drawings. The scope of the invention is limited only by the claims; numerous alternatives, modifications and equivalents are encompassed. For the purpose of clarity, technical material that is known in the technical fields related to the embodiments has not been described in detail to avoid unnecessarily obscuring the description.

Figure 1:
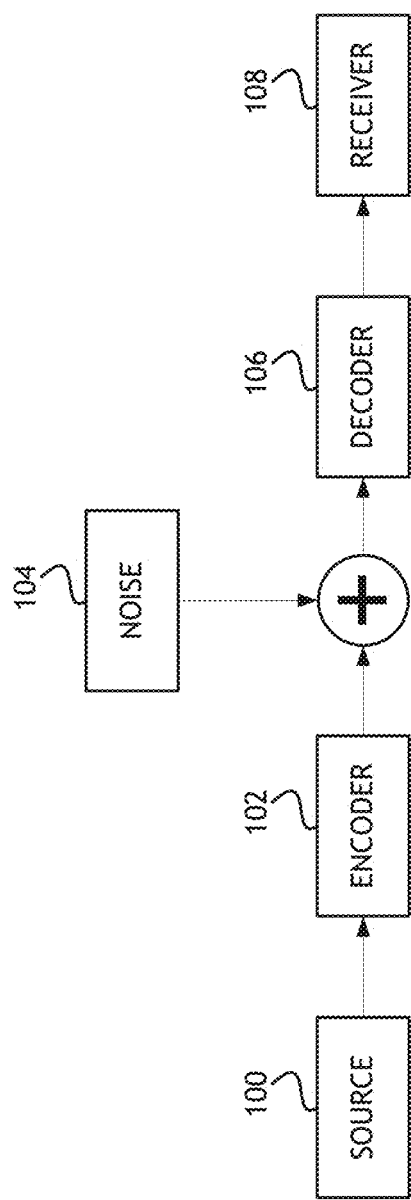
FIG. 1 shows a block diagram of a data transmission path for a low-density parity-check code.

Referring to FIG. 1, a block diagram of a data transmission path for a low-density parity-check code is shown. In at least one embodiment of the present invention, the standard data transmission path includes a signal source 100 that generates a signal for transmission. The signal produced by the source 100 is encoded by an encoder 102. The encoder 102 is a processor, or computer executable program code embodied in a processor, configured to add features to the signal that enhance data integrity. For example, the encoder 102 adds data bits to the signal according to some predetermined algorithm so that the signal may be recovered in the event of distortion. An example of a predetermined algorithm includes a low-density parity-check code configured to add one or more parity bits to each codeword in the signal.

The encoded signal is then transmitted. During transmission, signals may be subjected to noise 104. Noise 104 may distort one or more bits of the signal such that the signal is no longer an accurate representation of the signal produced by the source 100. The noise distorted signal is received by a decoder 106. The decoder 106 analyzes the noise distorted signal according to an algorithm complimentary to the algorithm used by the encoder 104. Where the algorithm includes a low-density parity-check code, the decoder 106 utilizes one or more parity bits generated by the low-density parity-check code to recover noise distorted bits in the noise distorted signal. The recovered signal is then sent to a receiver 108.

Figure 2:
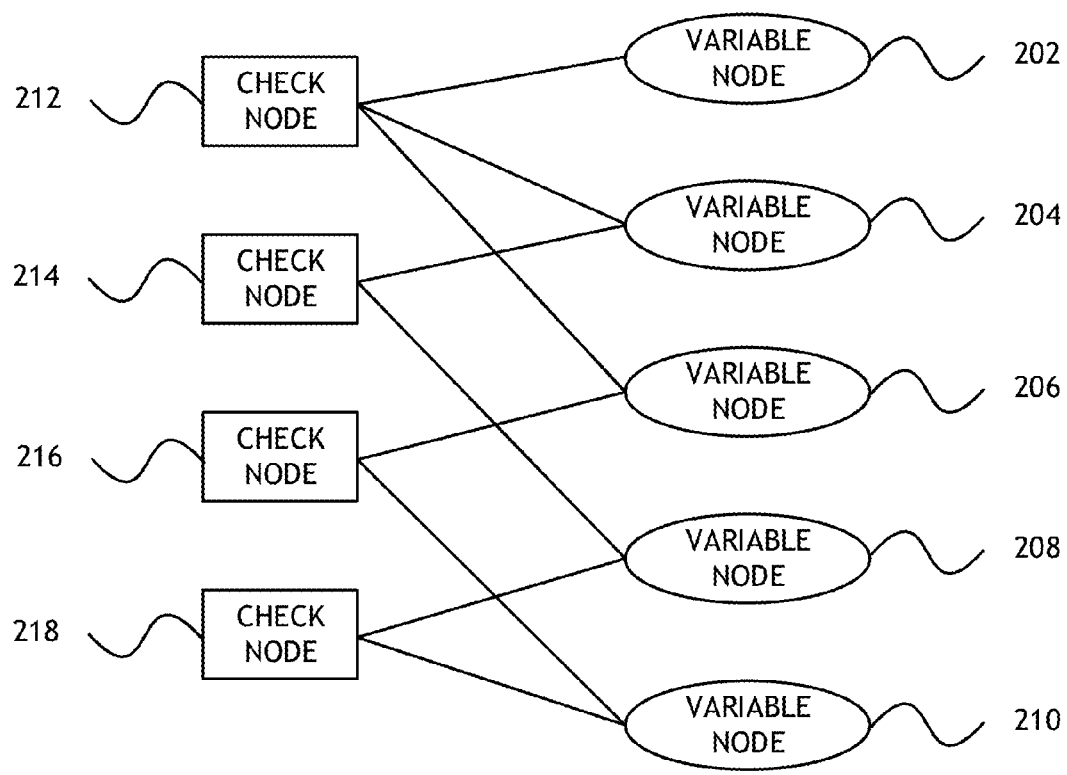
FIG. 2 shows a tanner graph of a low-density parity-check code.

Referring to FIG. 2, a tanner graph of a low-density parity-check code is shown. A tanner graph related to a low-density parity-check code is a graphic representation of the corresponding parity-check matrix. In at least one embodiment of the present invention, the columns of that matrix are represented by variable nodes 202, 204, 206, 208, 210 and the rows (check equations) are represented by check nodes 212, 214, 216, 218. The tanner graph in FIG. 2 shows a low-density parity-check code wherein a first check node 212 represents an equation corresponding to the parity-check matrix having the following non-zero variables: a first variable node 202, a second variable node 204 and a third variable node 206; a second check node 214 represents an equation having the following non-zero variables: the second variable node 204 and a fourth variable node 208; a third check node 216 represents an equation having the following non-zero variables: the third variable node 206 and a fifth variable node 210; and a fourth check node 218 represents an equation having the following non-zero variables: the fourth variable node 208 and the fifth variable node 210. One skilled in the art may appreciate that a tanner graph may be a representation of a low-density parity-check code parity-check matrix, where check nodes correspond to rows, variable nodes correspond to columns, and check nodes and variable nodes are connected if a nonzero value stays in the intersection of the corresponding row and column.

There are two potential error conditions based on signal noise in low-density parity-check decoding. In the first error condition, the signal received by the decoder does not correspond to a valid codeword; in that case the decoder may be able to recover the signal based on an algorithm using parity information contained in the signal, or the signal may be unrecoverable if the distortion is severe enough. The second error condition, herein called miscorrection, involves a distorted signal that is decoded to a valid but incorrect codeword, in which case the decoder may falsely believe that the signal has been properly decoded. Miscorrection may result when a valid codeword is distorted by noise in a particular way such that the distorted signal becomes closer to another (incorrect) valid code word, different from the correct one. The conditions that may produce miscorrection are specific to the particular low-density parity-check code; furthermore, the probability of miscorrection is associated with the nature and extent of signal noise, and the statistical distribution of various codewords.

Signal noise includes additive white Gaussian noise, partial response, jitter, and other effects due to noisy transmission channels.

Figure 3:
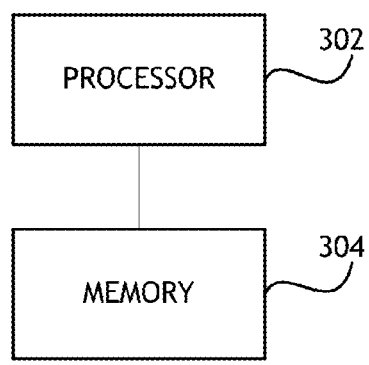
FIG. 3 shows a block diagram of a computing device useful for implementing embodiments of the present invention.

Referring to FIG. 3, a block diagram of a computing device useful for implementing embodiments of the present invention is shown. In at least one embodiment of the present invention, the computing device includes a processor 302 connected to a memory 304. The processor 302 is configured to execute computer executable program code to implement methods according to embodiments of the present invention. The memory 304 is configured to store computer executable program code to implement methods according to embodiments of the present invention and to store output of embodiments of the present invention in appropriate data structures.

Figure 4:
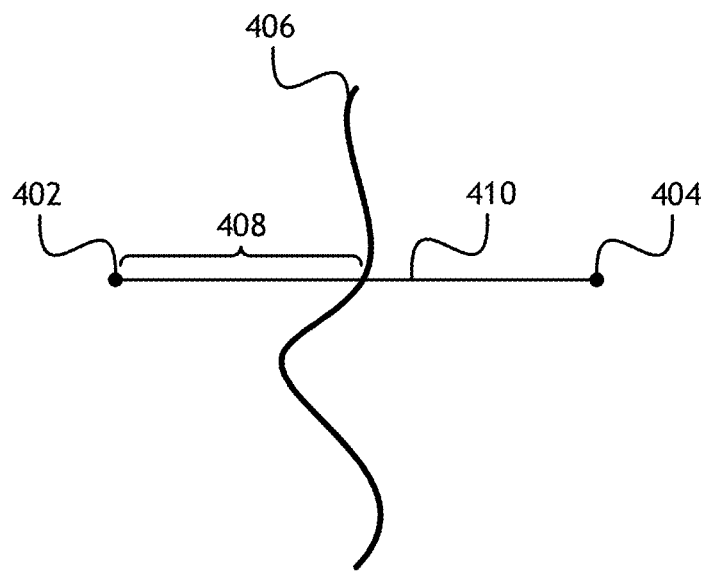
FIG. 4 shows a graph representation of an error boundary.

Referring to FIG. 4, a graph representation of an error boundary is shown. In at least one embodiment of the present invention, when analyzing a low-density parity-check code, an error boundary 406 is identified by finding a critical noise level for various segments 410 defined by a codeword 402 and a trapping set 404. Noise is injected into a codeword 402 at various levels and then decoded. A critical noise level is the noise level wherein noise injected into a codeword for a particular low-density parity-check code causes the codeword to be erroneously decoded into the trapping set 404 instead of the codeword 402. The critical noise level for a particular codeword defines a distance 408. A collection of distances 408 defines an error boundary 406. Establishing an error boundary 406 requires numerous iterations involving numerous segments 410 and numerous noise level iterations for each segment 410. Processing iterations to define an error boundary 406 requires substantial time and resources, and may produce erroneous results.

Figure 5:
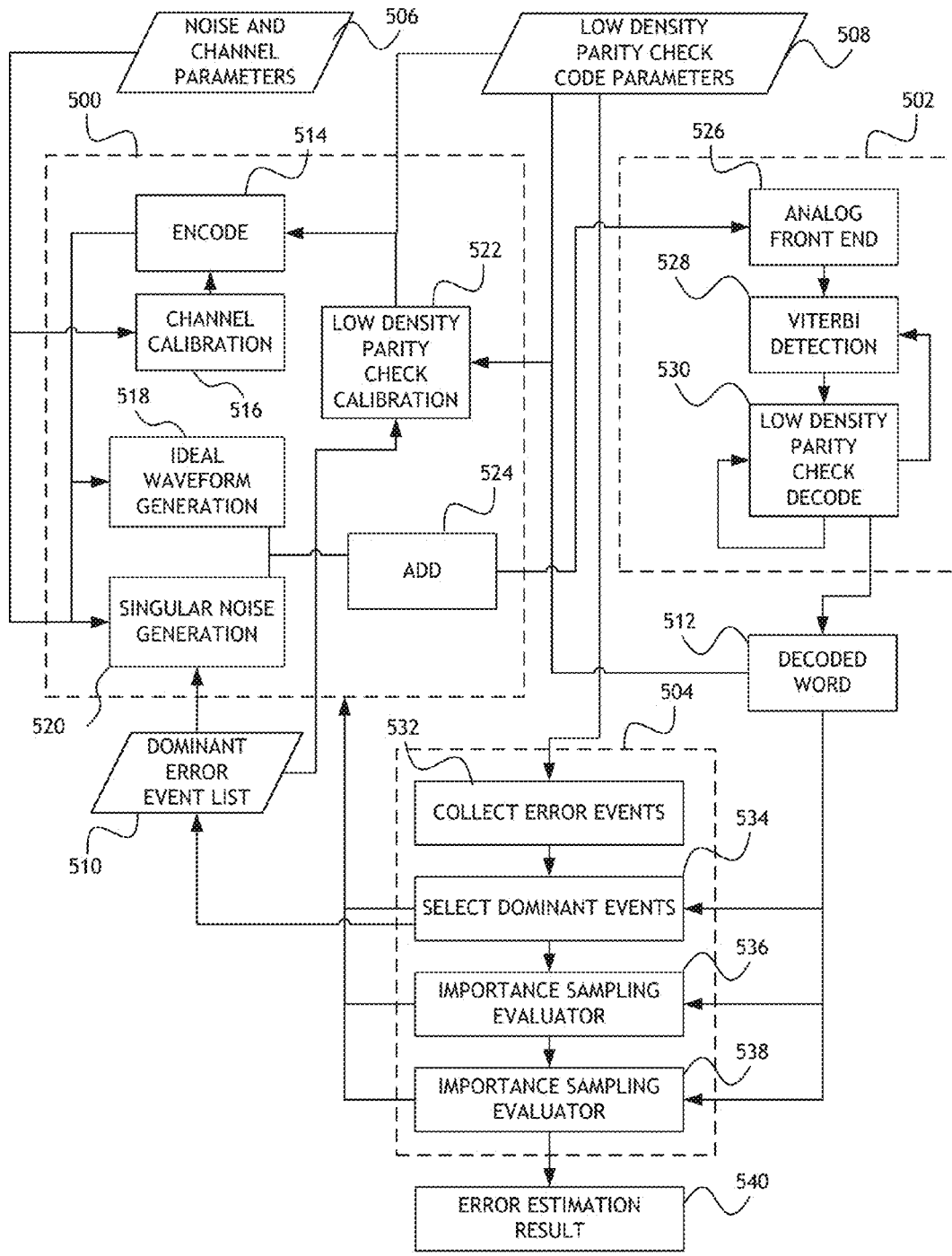
FIG. 5 shows a flowchart of a method for estimating an error rate in a low-density parity-check decoding using encoder calibration.

Referring to FIG. 5, a flowchart of a method for estimating an error rate in a low-density parity-check decoding using encoder calibration is shown. In at least one embodiment of the present invention, a method for estimating error rates includes procedures for random signal generation 500, procedures for low-density parity-check decoding 502 and procedures for error rate evaluation 504. In one embodiment, the procedures for random signal generation 500 include encoding 514. In at least one embodiment, encoding 514 requires low-density parity-check code parameters 508 and channel calibration 516 as inputs. The encoded signal is used for ideal waveform generation 518 and signal noise generation 520. Ideal waveform generation 518 produces an ideal waveform $\bar{r}$ based on a codeword $\bar{c}$, and in some embodiments an ideal waveform $\bar{r}'$ based on a bit flipped waveform $\bar{c}'$. In at least one embodiment, signal noise generation 520 produces a noised waveform that is a summation of biased and injected noise components. The ideal waveform and signal noise are combined 524 into a test waveform and delivered to an analog front end 526 in the procedures for low-density parity-check decoding 502.

In at least one embodiment of the present invention, the procedures for error rate evaluation 504 consist of collecting error events 532 based on given low-density parity-check code parameters 508. Error events are collected 532. Error events are collected 532 through any methodology capable of determining error events for a given low-density parity-check code having a certain number of variable nodes and a low-density parity-check matrix. In at least one embodiment, the output of collected error events is a list of a certain length, each element being a set of bit indexes. Where the low-density parity-check code is binary, the set of bit indexes is a list of variable nodes and for non-binary low-density parity-check codes the set of bit indexes is built from variable nodes and corresponding variable values.

When the error events are collected 532, dominant error events are selected 534 from the list of collected error events. Dominant error events are those that produce relatively higher error rates when noise is injected at bit indexes identified by the set of bit indexes in each element of the list of error events. Dominant error events are selected 534 using the procedures for random signal generation 500 and the procedures for low-density parity-check decoding 502 in an iterative process as more fully described herein.

Dominant error events are sent to a first importance sampling evaluator 536 and, in at least one embodiment of the present invention, then to a second importance sampling evaluator 538. One methodology used by the first importance sampling evaluator 536 is based on generating noised waveforms $\bar{n}(s,TS)$ from the summation of biased and injected noise $\bar{n}_{injection}(s,TS)+\bar{n}_{biasing}(TS)$ for a given injection level s and given error event position TS as described herein. In this embodiment, the first importance sampling evaluator 536 produces an error rate estimation according to the formula:

$$P(\text{error}) \approx \sum_{TS} P(\text{error}|TS)P(TD) = \sum_{TS} P(TS) \int_{-\infty}^{+\infty} P(\text{error}|TS,s)ds$$

where P(error|TS,s) is estimated using Monte-Carlo simulations and the procedures for low-density parity-check decoding 502 receive noise biased and injected test waveforms $\bar{y}=\bar{r}+\bar{n}(s,TS)$ as inputs. The first importance sampling evaluator 536 delivers error estimations according to:

$$P(\text{error}|TS,i)=\int_{-\infty}^{+\infty} P(\text{error}|TS,s,i)ds$$

to the second importance sampling evaluator 538, where i is the index of a dominant codeword class for which estimation are being provided.

Low-density parity-check encoding 514 produces a codeword belonging to a codeword class. In at least one embodiment of the present invention, codewords are organized into classes. For a particular low-density parity-check code, each possible codeword has characteristics that make certain error events more or less likely for a particular channel model. Identifying those characteristics and organizing codewords into classes allows for faster testing because testing can be focused on classes of codewords with the highest probability of producing an error event for a particular noise channel. In one embodiment, encoding 514 generates random codewords until a codeword in the desired class is generated. Because there are always a finite number of possible codewords, random generation is possible. In another embodiment, a random sequence of bits is generated with bits at certain indexes set to guarantee the sequence of bits will be in a particular class. This embodiment is possible where classes are defined by specific bit index relationships. The sequence is then multiplied by a parity check matrix to produce a syndrome and the syndrome is passed as an input during low-density parity-check decoding 530. The number of unsatisfied checks is then calculated according to the formula:

$$NUSC=\Sigma \bar{s} \oplus H\bar{c}'$$

Provided the statistical properties of various sequences of bits are known, the two methods are substantially equivalent.

In at least one embodiment of the present invention, the procedures for low-density parity-check decoding 502 includes an analog front end 526 and iterative turbo-decoding pair consisting of Viterbi hard or soft detection 528 and low-density parity-check decoding 530. Other decoding architecture is envisioned by the inventors. The procedures for low-density parity-check decoding 502 produces a decoded word 512. The decoded word 512 is used to select dominant events 534, calibrate 522 the low-density parity-check encoder and in first importance sampling evaluator 536 and second importance sampling evaluator 538. The decoded word 512 is compared to the original word to determine if an error occurred.

In at least one embodiment of the present invention, codewords are classified on the basis of bit patterns. One possible bit pattern vector N×k for a codeword $\bar{c}$ is defined by the vector, given a certain error event TS and odd natural number N greater than zero:

$$\text{pattern}(\bar{c}, N, TS) = \\ \left( \begin{array}{c} c_{i_1-\frac{N-1}{2}}, c_{i_1-\frac{N-1}{2}+1}, \ldots, c_{i_1+\frac{N-1}{2}}, c_{i_2-\frac{N-1}{2}}, c_{i_2-\frac{N-1}{2}}, c_{i_2-\frac{N-1}{2}+1}, \ldots, \\ c_{i_2+\frac{N-1}{2}}, \ldots, c_{i_k-\frac{N-1}{2}}, c_{i_k-\frac{N-1}{2}+1}, \ldots, c_{i_k+\frac{N-1}{2}} \end{array} \right)$$

In a channel where two codewords $\bar{c}_1$ and $\bar{c}_2$ having equal bit patterns pattern($\bar{c}_1$, N,TS) and pattern($\bar{c}_2$, N,TS) respectively have a substantially equal probability of generating errors, such channel has bit pattern equivalence. In a channel where the probability of generating errors is substantially equal for two codewords $\bar{c}_1$ and $\bar{c}_2$, and where respective bit patterns pattern($\bar{c}_1$, N,TS) and pattern($\bar{c}_2$, N,TS) are equal when N adjacent bits in positions $$i_j - \frac{N-1}{2}, i_j - \frac{N-1}{2}, \ldots, i_j - \frac{N-1}{2}$$

for some TS index j are inverted, such channel has bit inversion equivalence. In a channel where two codewords' $\bar{c}_1$ and $\bar{c}_2$ respective bit patterns pattern($\bar{c}_1$, N,TS) and pattern($\bar{c}_2$, N,TS) become equal when two N bits neighborhoods are swapped for any TS indexes $j_1$ and $j_2$, such codewords $\bar{c}_1$ and $\bar{c}_2$ generate substantially the same error probability of errors, such channel has TS variable neighborhood equivalence. For example:

$$\left( \begin{array}{c} \ldots, c_{i_{j_1}-\frac{N-1}{2}}, c_{i_{j_1}-\frac{N-1}{2}+1}, \ldots, c_{i_{j_1}+\frac{N-1}{2}}, \ldots, \\ c_{i_{j_2}-\frac{N-1}{2}}, c_{i_{j_2}-\frac{N-1}{2}+1}, \ldots, c_{i_{j_2}+\frac{N-1}{2}} \end{array} \right)$$

and $$\left( \begin{array}{c} \ldots, c_{i_{j_2}-\frac{N-1}{2}}, c_{i_{j_2}-\frac{N-1}{2}+1}, \ldots, c_{i_{j_2}+\frac{N-1}{2}}, \ldots, \\ c_{i_{j_1}-\frac{N-1}{2}}, c_{i_{j_1}-\frac{N-1}{2}+1}, \ldots, c_{i_{j_1}+\frac{N-1}{2}} \end{array} \right)$$

have substantially the same probability of error where unlisted bits are identical. In a channel where two codewords' $\bar{c}_1$ and $\bar{c}_2$ respective bit patterns pattern($\bar{c}_1$, N, TS) and pattern($\bar{c}_2$,N,TS) become equal in terms of average error rate when bits are symmetrically reflected in N adjacent index positions for some TS index j, and corresponding codewords $\bar{c}_1$ and $\bar{c}_2$ generate substantially the same probability of errors, such channel has central symmetry equivalence. For example:

$$i_j - \frac{N-1}{2}, i_j - \frac{N-1}{2} + 1, \ldots,$$
$$i_j + \frac{N-1}{2} \rightarrow i_j + \frac{N-1}{2}, i_j - \frac{N-1}{2} 1, \ldots, i_j - \frac{N-1}{2}$$

In at least one embodiment, the set of all codewords for a given low-density parity-check code are split into classes base on one or more of the equivalences; bit pattern equivalence, bit inversion equivalence, TS variable neighborhood equivalence and central symmetry equivalence. Equivalences are specific to particular error events. Once codewords are organized into classes, classes are prioritized. In at least one embodiment of the present invention, prioritization of classes is performed through importance sampling.

In at least one embodiment of the present invention, the second importance sampling evaluator 538 iterates through a set of dominant codeword classes. Where the set includes M codeword classes, the second importance sampling evaluator 538 makes M calls to the first importance sampling evaluator 536 according to the formula:

$$P(\text{error}) \approx \sum_{TS} \left( P(TS) \left[ \sum_{i=1}^{M} P(\text{error} | TS, i) P(TS, i) \right] \right)$$

In at least one embodiment of the present invention, channel calibration 516 requires noise and channel parameters 506 and includes estimating two sets of parameters to properly calibrate a processor for encoding 514. The first set of parameters is an average Euclidian distance $D(\bar{p},TS)$, for each of a set of codewords 15, between an ideal waveform signal $f_{\bar{c}}^{-1}(\bar{r})$ and an ideal bit-flipped wave form signal $f_{\bar{c}}^{-1}(\bar{r}')$ associated with a trapping set. The ideal bit-flipped waveform signal is an ideal waveform signal generated using a codeword with bits flipped in position indexes defined by a trapping set.

The second set of parameters is an estimated probability, for each class of codewords, that a random codeword will have a pattern equivalent to one of the codewords in the class. In at least one embodiment, probabilities are estimated based on combinatorial considerations where the total number random dom uniformly distributed bit sequences are equivalent to one from the class. Furthermore, such estimations can take into account adjacent bit sequence distribution due to encoding techniques.

In at least one embodiment of the present invention, calibration 516 uses the following analytical considerations:

$$D(\bar{p},TS) = \|f_{\bar{c}}^{-1}(\bar{r}) - f_{\bar{c}}^{-1}(\bar{r}')\| = \|f_{\bar{c}}^{-1}(\bar{r} - \bar{r}')\|$$

Where a linear filter $f_{\bar{c}}$ and inverse filter $f_{\bar{c}}^{-1}$ both work locally, the level of data dependent noise depends on only some a small neighborhood of the corresponding bit positions. Where this local dependency is such that the "radius" of dependency is less that the smallest distance between error event positions, it may be determined that:

$$\begin{aligned} D(\bar{p}, TS)^2 &= \|f_{\bar{c}}^{-1}(r) - f_{\bar{c}}^{-1}(\bar{r}')\|^2 \\ &= \|f_{\bar{c}}^{-1}(\bar{r} - \bar{r}')\|^2 \\ &\approx \|f_{\bar{c}}^{-1}(00 \ldots 0r_{i_1} 00 \ldots 0r_{i_2} 00 \ldots 0r_{i_k} 00 \ldots 0)\|^2 \\ &= \left\| \begin{array}{c} f_{\bar{c}}^{-1}(00 \ldots 0r_{i_1} 00 \ldots 0) + \\ f_{\bar{c}}^{-1}(00 \ldots 0r_{i_2} 00 \ldots 0) + \ldots + \\ f_{\bar{c}}^{-1}(00 \ldots 0r_{i_k} 00 \ldots 0) \end{array} \right\|^2 \\ &= \sum_{j=1}^{k} \|f_{\bar{c}}^{-1}(00 \ldots 0r_{i_j} 00 \ldots 0)\|^2 \\ &= \sum_{j=1}^{k} D(\bar{p})^2 = > D(\bar{p}) \end{aligned}$$

-continued $$= \sqrt{\sum_{j=1}^{k} D_{\overline{p}_j}^2}$$

Where the linear filter $f_{\overline{c}}$ operates locally, channel calibration 516 finds local differences between an ideal waveform signal for N bits of pattern $\overline{p}$ and an ideal waveform for a bit flipped signal; that is to say, a signal with the central bit of the N bits inverted. Local distances $D_{\overline{p}_j}$ do not depend on error event positions, and so may be calculated analytically during channel calibration 516. Distance $D(\overline{p})$ for each $\overline{p}$ is reconstructed from a vector distance $D_{\overline{p}_j}$ of length $2^N$.

Probabilities P(i) are then calibrated. In one exemplary embodiment, a N×k bit pattern has two error event variables (k=2) and three adjacent bit positions (N=3) and therefore 3×2 bit patterns. Where the channel for such bit pattern has bit pattern equivalence, bit inversion equivalence and TS variable equivalence, bit patterns can be divided into the following six classes:

1) 2x000: 000 000, 111 000, 000 111 and 111 111
2) 1x000 1x010: 000 010, 000 101, 010 000, 101 000, 111 010, 111 101, 010 111 and 101 111
3) 2x010: 010 010, 010 101, 101 010 and 101 101
4) 1x000 1x011: 000 011, 000 100, 000 110, 000 001, 011 000, 100 000, 110 000, 001 000 and similar with 000→111
5) 1x010 1x011: 010 011, 010 100, 010 110, 010 001, 011 010, 100 010, 110 010, 001 010 and similar with 010→101
6) 2x011: 011 011, 011 100, 011 110, 011 001, 100 011, 100 100, 100 110, 100 001, 110 011, 110 100, 110 110, 110 001, 001 011, 001 100, 001 110, 001 001.

The sizes of these classes are 4, 8, 4, 16, 16 and 16. The combinatorial components of P(i) are: P(1)=1/16, P(2)=1/8, P(3)=1/16, P(4)=1/4, P(5)=1/4, P(6)=1/4. A person skilled in the art may appreciate that this example is only exemplary and that other factors may apply. For example, in one embodiment, calibration results depend on the frequency of bit-triples from the decoder being uniformly distributed; uniform distribution may not occur when using run length limited/maximum transition run encoding.

In another example, P(000)=P(111)=α, P(010)=P(101)=β, P(011)=P(011)=P(100)=P(001)=γ and 2α+2β+4γ=1. In this case the calibrated values of P(i) are $$P(1) = \frac{\alpha^2}{16}, P(2) = \frac{\alpha\beta}{8}, P(3) = \frac{\beta^2}{16},$$

$$P(4) = \frac{\alpha\gamma}{4}, P(5) = \frac{\beta\gamma}{4}, P(6) = \frac{\gamma^2}{4}.$$

In this more generalized case, P(i) is calculated using multinomial coefficients from the polynomial $(\alpha+\beta+\gamma)^k$. Therefore, for N=3:

$$P_{i_1,i_2,i_3} = \binom{k}{i_1, i_2, i_3} \alpha^{i_1} \beta^{i_2} \gamma^{i_3}$$

where $0 \le i_1, i_2, i_3 \le k$, $i_1+i_2+i_3=k$ and the multinomial coefficient $$\binom{k}{i_1, i_2, i_3} = \frac{k!}{i_1! i_2! i_3!}.$$

While the forgoing has been based on N=3, a person skilled in the art may appreciate that calculations based on greater values of N are possible.

Channel calibration 516 depends on the number of error event positions k. In at least one embodiment, channel calibration 516 is performed for each reasonable number of error event positions up to some maximum number. In at least one embodiment, the maximum number of error event positions is less than a value of minimal distance for a given low-density parity-check code.

For an additive white Gaussian noise channel with a Gaussian noise distribution function N(0,σ) where σ is a noise standard deviation value corresponding to a signal-to-noise ratio in the system, the signal noise generation 520 produces a noise vector n based on a codeword $\overline{c}$ and a bit flipped waveform $\overline{c}'$ produced by flipping bits in index positions defined by a dominant error event. In such an embodiment, ideal waveform generation 518 includes an ideal waveform $\overline{r}$ based on the codeword $\overline{c}$, and an ideal waveform $\overline{r}'$ based on the bit flipped waveform $\overline{c}'$. A normalized noise injection direction vector $\overline{e}_c$ is defined as:

$$\overline{e}_c = \frac{\overline{r} - \overline{r}'}{\|\overline{r} - \overline{r}'\|}$$

Using this notation, the signal noise generation 520 produces a noise vector n representable as the sum of biased noise and injection noise such that $\overline{n} = \overline{n}_{injection} + \overline{n}_{biasing}$ where the injection component $\overline{n}_{injection}$ is proportional to a noise injection value s from the noise and channel parameters 506 and collinear to the injection component direction: $\overline{n}_{injection} = s\overline{e}_c$. The biasing component $\overline{n}_{biasing}$ is generated using additive white Gaussian noise $\overline{n}_{awgn}$ generation such that: $\overline{n}_{biasing} = \overline{n}_{awgn} - (\overline{n}_{awgn}, \overline{e}_c)\overline{e}_c$ so that $\overline{n}_{biasing} \perp \overline{n}_{injection}$ where $(\overline{n}_{biasing}, \overline{e}_c)$ is a scalar product of $\overline{n}_{biasing}$ and $\overline{e}_c$.

For channel models other that additive white Gaussian noise, for example data dependent partial response and jitter channels, there is a linear transformation $f_{\overline{c}}$ that produces a good approximation of data-dependent injection noise from additive white Gaussian noise as defined herein:

$$\overline{n}_{biasing} = f_{\overline{c}}(\overline{n}_{awgn} - (\overline{n}_{awgn}, \overline{e}_c)\overline{e}_c)$$

where the injection direction is calculated using the formula:

$$\overline{e}_c = \frac{f_{\overline{c}}^{-1}(\overline{r} - \overline{r}')}{\|f_{\overline{c}}^{-1}(\overline{r} - \overline{r}')\|}$$

where $f_{\overline{c}}^{-1}$ is linear filter inverse of $f_{\overline{c}}$. Injection noise is determined by either $$\overline{n}_{injection} = f_{\overline{c}}(s\overline{e}_c) \text{ or } \overline{n}_{injection} = s\frac{\overline{r} - \overline{r}'}{\|f_{\overline{c}}^{-1}(\overline{r} - \overline{r}')\|}.$$

In at least one embodiment of the present invention, the linear filter $f_{\overline{c}}$ works locally so that the level of data-dependent noise depends on only a small neighborhood of corresponding bit positions.

In at least one embodiment, encoding 514 produces a codeword $\bar{c}$ and a probability $P(\bar{c})=P(TS,i)$ of the codeword $\bar{c}$ occurring. In at least one embodiment, encoding 514 only outputs dominant codewords in a dominant codeword class i based on an error event TS for which the dominant codeword class i is calibrated.

Error rate estimation uses randomly generated bits encoded with a low-density parity-check encoding method. Encoding adds parity bits and in some cases other encoding techniques add preambles and post-ambles to the encoded words. The particular encoding methodologies and techniques may be controlled by one or more parameters. In at least one embodiment of the present invention, such parameters are included in the low-density parity-check code parameters 508.

In at least one embodiment of the present invention, encoding 514 is specifically limited to codewords from dominant codeword classes defined during channel calibration 516. In this embodiment, encoding 514 requires an input associated with an index of at least one dominant codeword class. In addition to an encoded codeword, encoding 514 also produces a probability of the codeword being generated during encoding 514.

In at least one embodiment of the present invention, ideal waveforms $\bar{r}$ are generated 518 corresponding to an input codeword $\bar{c}$ from the encoding 514 processes. In at least one embodiment, ideal waveforms $\bar{r}$ are channel specific; for example, partial response channel model waveforms are generated by convolving the codeword with a partial response target vector P such that $\bar{r}=BPSK(\bar{c}) \otimes P$. In this context, BPSK( ) refers to BPSK modulation where BPSK(0)=−1 and BPSK(1)=1.

In at least one embodiment of the present invention, singular noise generation 520 produces a noise vector n equal in length to the codeword produced from the encoding 514 process. Signal noise generation 520 receives an encoded codeword from the encoding 514 procedures, dominant errors from a dominant error event list 510 comprising error event position vectors and a noise injection value s from the noise and channel parameters 506. The noise vector n and ideal waveform $\bar{r}$ are combined 524 into a test signal $\bar{y}$.

Encoding, testing and classifying are iterative operations. In at least one embodiment of the present invention, the encoding 514 process receives a parity-check matrix from the low-density parity-check code parameters 508, at least one index of a dominant codeword class from low-density parity-check calibration 522 and at least one error event from channel calibration 516 to define what set of dominant codeword classes to use. From these inputs, the encoding 514 process produces a codeword from the dominant codeword class corresponding to the index and a probability of a random codeword belonging to the dominant codeword class based on the error event and index. In one embodiment, such probability is provided during low-density parity-check calibration 522.

Low-density parity-check calibration 522 takes into account dependency on error event positions TS. In at least one embodiment of the present invention, low-density parity-check calibration 522 incorporates approximate error rates of different codeword classes when injecting noise towards positions of a given error event TS.

TS dependent calibration results in a rough estimation of conditional probabilities $\hat{P}(error|TS,i)$ for a random codeword from a particular class i to produce errors when noise is injected toward an error event TS. In at least one embodiment of the present invention, such estimation requires an estimated average relative error boundary distance $\epsilon(i,TS)$ for codewords in each class i. The estimated average relative error boundary distance $\epsilon(i,TS)$ is then multiplied by a calibrated distance $D(\bar{p}_i)$ between an ideal waveform and a bit flipped ideal waveform to estimate an absolute error distance $d(i,TS)=D(\bar{p}_i) \times \epsilon(i,TS)$. Conditional probability $\hat{P}(error|TS,i)$ is then determined as a probability that a Gaussian random variable will obtain a value larger that the absolute error distance $d(i,TS)$:

$$\hat{P}(error|TS,i) \approx Q(d(i,TS)/\sigma_i)=Q(D(\bar{p}_i) \times \epsilon(i,TS)/\sigma_i)$$

where:

$$Q(x) = \frac{1}{\sqrt{2\pi}} \int_x^\infty \exp\left(-\frac{u^2}{2}\right) du$$

and $\sigma_i$ is a noise standard deviation value corresponding to a signal-to-noise ratio and class i.

In at least one embodiment of the present invention, the average relative error boundary distance $\epsilon(i,TS)$ is estimated by iteratively running procedures for low-density parity-check decoding 502. In at least one embodiment, the number of iterations is relatively small. For example, where $\epsilon(i,TS)$ depends only on the N×k bit pattern of a codeword $\bar{c}$ from a class i for a given error event TS, $\epsilon(i,TS)$ is a some function of N×k binary variables $F:(E_2)^{N \times k} \to R_+$ such that $\epsilon(i,TS) \approx F(nb_1, nb_2, \ldots, nb_j, \ldots, nb_k)$ where $$nb_j = \left(i_j - \frac{N-1}{2}, i_j - \frac{N-1}{2}+1, \ldots, i_j + \frac{N-1}{2}\right).$$

In at least one embodiment of the present invention, estimating $\epsilon(i,TS)$ does not require complete N bits neighborhoods. All that is required is which class of equivalence for N×1 contains a particular $nb_j$ for all j=1 . . . k. For example, assuming t classes of equivalence for N×1 bit patterns, w(t) is some real value associated with each class, and $T: (E_2^N) \to \{1, 2, \ldots, t\}$ gives a correspondence between the N×1 bit pattern and its class. For any N bits neighborhood of the $j^{th}$ TS variable, the associated value is computed as $z_j = w(T(nb_j))$. The average relative error boundary distance $\epsilon(i,TS)$ can therefore be estimated by:

$$f(z_1, z_2, \ldots, z_k)=f(w(T(nb_1)), w(T(nb_2)), \ldots, w(T(nb_k)))$$

where $f:R^k \to R_+$. Estimation will be of a form $f(z_1, z_2, \ldots, z_k)$ where each $z_1$ is a deterministic function of N bits neighborhood $nb_j$ of $j^{th}$ TS variable.

Assuming $f$ is a linear function:

$$f(z_1, z_2, \ldots, z_k)=a_1 \times z_1 + a_2 \times z_2 + \ldots + a_k \times z_k + b$$

decoding and calibration iterations are run until coefficients $a_1, a_2, \ldots, a_k$ and b are found. In at least one embodiment of the present invention, it may be presumed that $a_1=a_2=\ldots=a_k$, but doing so reduces the quality of the estimation. Running the decoder a limited number of times on codewords from a particular class i produces a corresponding value $\epsilon$. Running n experiments would produce a system of n linear equations:

$$\begin{cases} a_1 \times z_1^1 + \ldots + a_k \times z_k^1 + b = \varepsilon_1, \\ a_1 \times z_1^2 + \ldots + a_k \times z_k^2 + b = \varepsilon_2, \\ \quad \ldots \\ a_1 \times z_1^n + \ldots + a_k \times z_k^n + b = \varepsilon_n, \end{cases}$$

where $(z_1^j \ldots z_k^j)$ denote values for error event neighborhoods corresponding to the $j^{th}$ experiment. The system of linear equations is then solved to find the coefficients. Where $t^k > k+1$, the least mean square method can be used, but any appropriate method for solving linear equations is acceptable. Once the coefficients are known, the relative error boundary distance $\epsilon(i,TS)$ can be estimated:

$$\epsilon(i,TS) \approx a_1 \times z_1 + a_2 \times z_2 + \ldots + a_k \times z_k + b$$

For all codewords in a particular class i, the relative error boundary distance $\epsilon(i,TS)$ can be determined using the same coefficients $a_1, a_2, \ldots, a_k$ and b.

Usually procedures for low-density parity-check decoding 502 take valuable time, especially when running millions of experiments to estimate the error probability on waterfall regions, so there is a strong need to reduce the number of experiments. According to at least one embodiment of the present invention, it is sufficient to run $t^k$ experiments, where t is the number of classes of equivalence for N×1 bit patterns and k is the number of error event TS variables.

When limiting the number of experiments, diverse inputs tend to produce the most robust results; therefore, a representative sampling of values $(z_1^j \ldots z_k^j)$ and corresponding codewords having bit patterns related to those values should be used. To meet these criteria, $t^k$ different codewords with bit patterns corresponding to k numbers $(z_1^j \ldots z_k^j)$ should be used; each of the k numbers can take one of t values. These additional criteria improve the resulting approximation but are not required to produce a usable estimation. Where additional resources are available, additional experiments can be run to improve the final estimation.

Once relative error boundary distances $\epsilon(i,TS)$ have been estimated, low-density parity-check calibration 522 can define a number M of dominant codeword classes. For each codeword class i, an error estimation value $\hat{P}(error,i|TS) = \hat{P}(error|TS,i)P(i)$ is calculated and estimation values $\hat{P}(error,i|TS)$, $i = 1, 2, \ldots, M$ are sorted in descending order. Codeword class indexes $(j_1, \ldots, j_M)$ corresponding to the first M values of the estimations are then selected. Probabilities P(TS,i) returned by an encoder can now be obtained from a stored set of values and dominant codeword class indexes according to the correlation:

$$(P(TS,1), P(TS,2), \ldots, P(TS,M)) = (P(j_1), P(j_2), \ldots, P(j_M))$$

Figure 6:
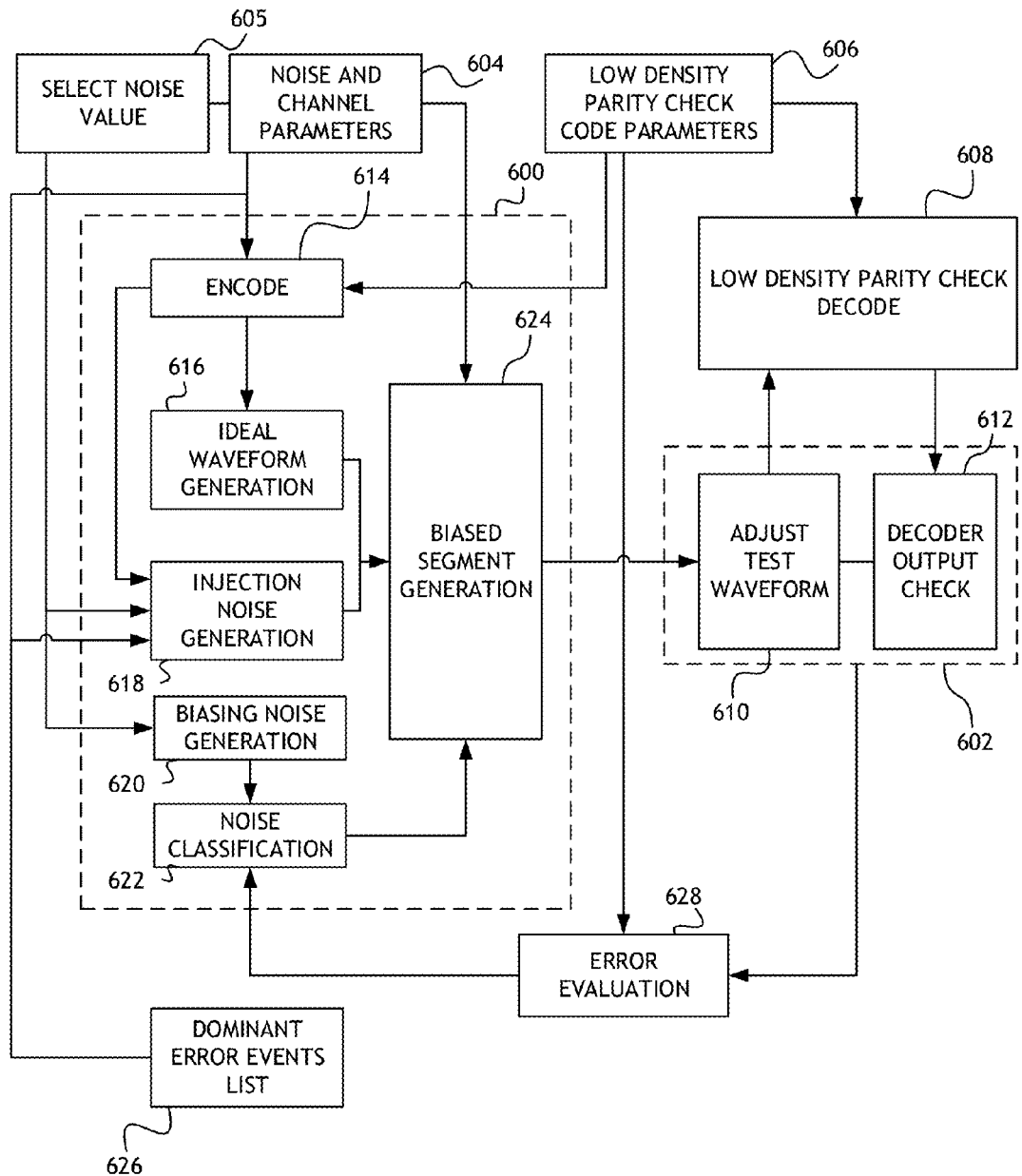
FIG. 6 shows a flowchart of a method for estimating error rates in a low-density parity-check code.

Referring to FIG. 6, a flowchart of a method for estimating error rates in a low-density parity-check code is shown. In at least one embodiment, the method includes procedures for random test signal generation 600, procedures for low-density parity-check decoding 608, procedures for binary searching 602 and procedures for error rate evaluation 628.

Procedures for random test signal generation 600 include encoding 614. In at least one embodiment, encoding 614 takes a selected noise value 605 taken from noise channel parameters 604, low-density parity-check code parameters 606 and a list of dominant error event 626 as inputs. Encoding 614 produces a codeword $\bar{c}$ of a certain length n according to a low-density parity-check code defined by the low-density parity-check code parameters 606; the codeword may be based on random bits or on some input. In at least one embodiment, the encoded codeword is not limited to adding parity bits to the original word, but also includes applying run length limited, maximum transition run or cyclic redundancy check encoding techniques, adding preambles and post-ambles to the codeword and interleaving data bits. Such additional operations are defined by the low-density parity-check code parameters 606. In at least one embodiment, encoding 614 utilizes codeword classes as defined herein to limit further processing to dominant codeword classes, thereby improving error estimation efficiency.

In at least one embodiment of the present invention, the codeword $\bar{c}$ output from encoding 614 is used to generate 616 an ideal waveform $\bar{r}$. Ideal waveform generation 616 produces a channel dependent soft value signal of a certain length n corresponding to the codeword $\bar{c}$. In one exemplary embodiment, a partial response channel model waveform is generated by convolving the codeword $\bar{c}$ with a partial response target vector P such that $\bar{r} = BPSK(\bar{c}) \otimes P$. In this context, BPSK( ) refers to BPSK modulation where BPSK(0) = −1 and BPSK(1) = 1.

In at least one embodiment of the present invention, injection noise $\bar{n}_{injection}$ having a certain length n is generated 618 based on a codeword $\bar{c}$, a noise injection value s from the noise and channel parameters 604 and an error event positions vector $TS = (i_1, i_2, \ldots, i_k)$ from the list of dominant error events 626.

For an additive white Gaussian noise channel, injection noise generation 618 produces an injection noise vector $\bar{n}_{injection}$ based on a codeword $\bar{c}$ and a bit flipped waveform $\bar{c}'$ produced by flipping bits in index positions defined by error event positions vector $TS = (i_1, i_2, \ldots, i_k)$. In such an embodiment, ideal waveform generation 616 includes an ideal waveform $\bar{r}$ based on the codeword $\bar{c}$, and an ideal waveform $\bar{r}'$ based on the bit flipped waveform $\bar{c}'$. A normalized noise injection direction vector $\bar{e}_c$ is defined as:

$$\bar{e}_c = \frac{\bar{r} - \bar{r}'}{\|\bar{r} - \bar{r}'\|}$$

Using this notation, injection noise generation 618 produces an injection noise vector $\bar{n}_{injection}$ is proportional to the noise injection value s and collinear to the injection component direction: $\bar{n}_{injection} = s\bar{e}_c$.

Biasing noise $\bar{n}_{biasing}$ is generated 620 using additive white Gaussian noise $\bar{n}_{awgn}$ generation such that: $\bar{n}_{biasing} = \bar{n}_{awgn} - (\bar{n}_{awgn}, \bar{e}_c)\bar{e}_c$ so that $\bar{n}_{biasing} \perp \bar{n}_{injection}$ where $(\bar{n}_{biasing}, \bar{e}_c)$ is a scalar product of $\bar{n}_{biasing}$ and $\bar{e}_c$. Biasing noise biasing and injection noise $\bar{n}_{injection}$ are orthogonal in n-dimensional Euclidean space.

For channel models other that additive white Gaussian noise, for example data dependent partial response and jitter channels, there is a linear transformation (filter) $f_{\bar{c}}$ that produces data-dependent injection noise from additive white Gaussian noise as defined herein:

$$\bar{n}_{biasing} = f_{\bar{c}}(\bar{n}_{awgn} - (\bar{n}_{awgn}, \bar{e}_c)\bar{e}_c)$$

where the injection direction is calculated using the formula:

$$\bar{e}_c = \frac{f_{\bar{c}}^{-1}(\bar{r} - \bar{r}')}{\|f_{\bar{c}}^{-1}(\bar{r} - \bar{r}')\|}$$

where $f_{\bar{c}}^{-1}$ is linear filter inverse of $f_{\bar{c}}$. Injection noise is determined by either $$\bar{n}_{injection} = f_{\bar{c}}(s\bar{e}_c) \text{ or } \bar{n}_{injection} = s\frac{\bar{r} - \bar{r}'}{\|f_{\bar{c}}^{-1}(\bar{r} - \bar{r}')\|}.$$

In practice, complex data-dependent noise channels, such as auto-regression models of jitter channels, can be represented in this form.

In at least one embodiment of the present invention, two signals $\bar{y}_{max}$ and $\bar{y}_{min}$ are generated 624 from the ideal waveform $\bar{r}$, the injection noise vector $\bar{n}_{injection}$, the biasing noise $\bar{n}_{biasing}$ and maximum and minimum injection noise values $s_{max}$ and $s_{min}$ from the noise channel parameters 604. In at least one embodiment, the signals are defined by:

$$\bar{y}_{max} = \bar{r} + \bar{n}_{injection}(s_{max}) + \bar{n}_{biasing}$$

and $$\bar{y}_{min} = \bar{r} + \bar{n}_{injection}(s_{min}) + \bar{n}_{biasing}$$

The two signals $\bar{y}_{max}$ and $\bar{y}_{min}$ are two ends of a segment defining a binary search area for an error boundary distance.

In at least one embodiment of the present invention, procedures for binary searching 602 receive the two signals $\bar{y}_{max}$ and $\bar{y}_{min}$ and perform a binary search to define an error boundary surface. A maximum noise signal $\bar{y}_{max}$ defines a codeword distorted by a defined maximum noise value; a minimum noise signal $\bar{y}_{min}$ defines a codeword distorted by a defined minimum noise value. A test waveform is decoded 608 and the decoded test waveform is checked 612 against the original coded word. In at least one embodiment, the test waveform is a the maximum noise signal $\bar{y}_{max}$. If the maximum noise signal $\bar{y}_{max}$ decodes correctly, the error boundary surface is defined as at least the maximum noise level and no further iterations are performed. If the maximum noise signal $\bar{y}_{max}$ decodes incorrectly, the test waveform is adjusted 610 and the adjusted test waveform is decoded 608 and checked 602 against the original coded word. In at least one embodiment, the test waveform is adjusted 610 according to a binary search algorithm. A binary search algorithm defines a number of iterations necessary to produce a desired level of accuracy, and at each iteration the injected noise value is adjusted according to principles of binary search. The output of the procedures for binary searching is an error boundary distance d, defining a critical noise level. The set of all error boundary distances $d_i$, one error boundary distance for each instance of biasing noise, defines an error boundary surface.

In at least one embodiment of the present invention, the set of all error boundary distances $d_i$ is evaluated 628 to estimate an error rate for a particular low-density parity-check code. In one embodiment, estimation is performed according to the formula:

$$P(s) = \frac{1}{N}\sum_{i=1}^{N} I(d_i < s)$$

where N is a number of biasing noise instances used for simulation of the segment defining the binary search area for the error boundary surface. The function $I(d_i<s)$ returns 1 if the statement is true and 0 is the statement is false.

Binary search produces an estimated error rate faster than simple simulation. Furthermore, the methods described herein allow for derivative calculations such as acceleration of the error rate without the need to acquire additional data points. In at least one embodiment of the present invention, the procedures for binary searching 602 are sped up further by predicting the outcome at a particular biasing noise $\bar{n}_{biasing}(i)$. Noise classification 622 identifies biasing noise $\bar{n}_{biasing}(i)$ that is likely to decode correctly at a maximum injection noise value $s_{max}$ and prevents such biasing noise from being used during biasing segment generation 624. Noise classification 622 is described more fully herein.

Figure 7:
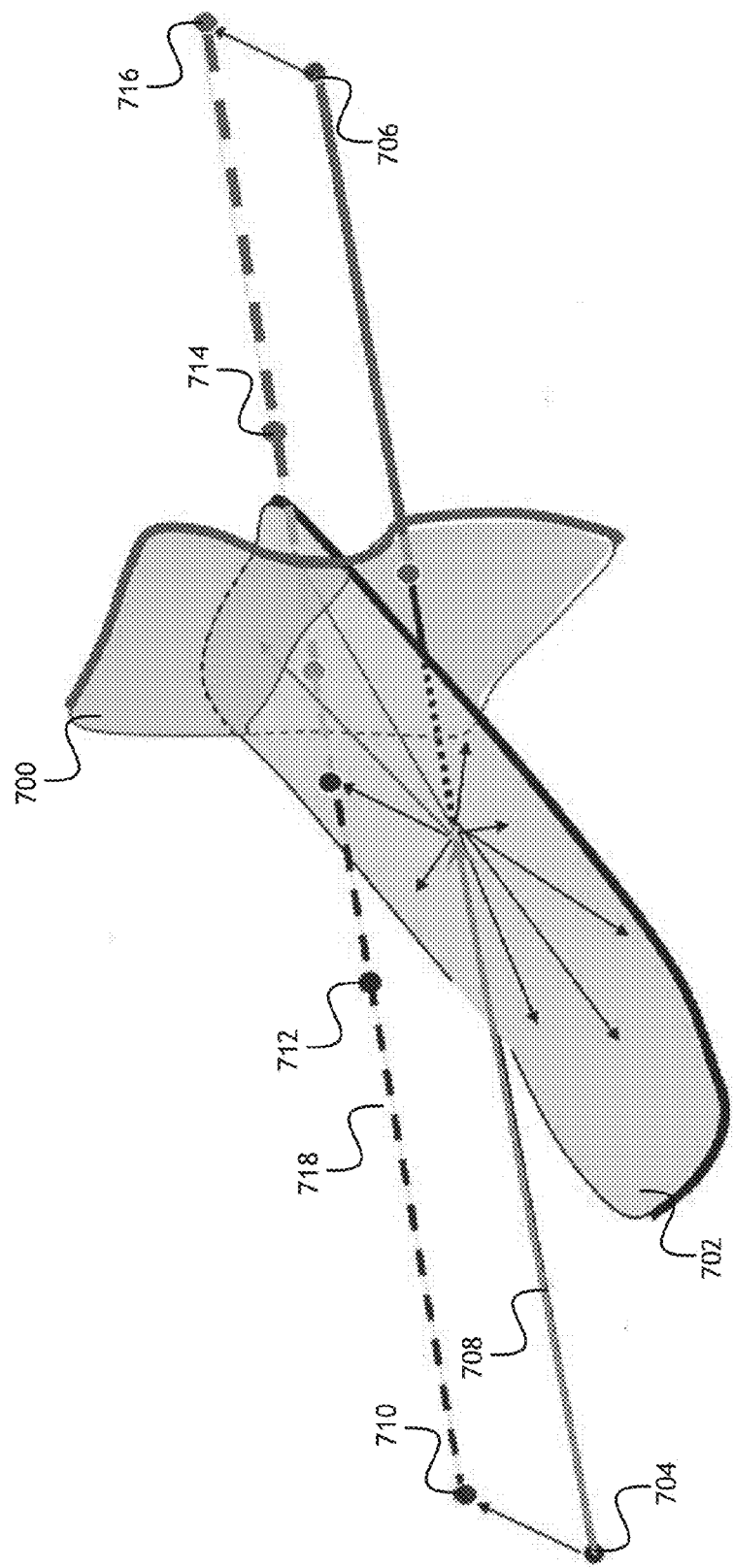
FIG. 7 shows a graphic representation of a biased binary search.

Referring to FIG. 7, a graphic representation of a biased binary search is shown. A valid codeword 704 and bit-flipped codeword 706 (error event, or trapping set TS) define a first segment 708. Movement along the first segment is controlled by a noise injection value s; higher noise injection values s tends to move a signal toward the error event 706, lower noise injection values s tend to move a signal toward the original codeword 704. Some hyperplane 702 exists where generated signal vector $\bar{y}$ resides. The geometrical representation of signals helps to imagine the situation. The signal vector $\bar{y}$ is calculated according to the formula:

$$\bar{y} = \bar{r} + \bar{n}_{injection}(s) + \bar{n}_{biasing}$$

as defined herein. The noise injection level s towards a given trapping set is fixed. Some instances of generated biasing noise $\bar{n}_{biasing}$ are shown by arrows. For each such instance we can draw a biased segment like 718, but these segments are not shown. There exists a subset of signals that is beyond an error boundary. The class of biasing noises that produce signals before and beyond the boundary defines an area of interest when classifying noise.

In an additive white Gaussian noise channel, biasing moves the valid codeword 704 orthogonally to produce a biased codeword 710, and moves the error event 706 orthogonally to produce a biased error event 716; in other noise channels, a valid codeword 704 and error event 706 are biased according to some function $f_{\bar{c}}$ that may not preserve orthogonality. The biased codeword 710 and biased error event 716 define a biased segment 718. Iterative encoding and decoding at various injection noise values along the biased segment 718 using binary search methodologies determines a point on an error boundary surface 700.

In at least one embodiment of the present invention, the number of iterations necessary to define the error boundary surface 700 is reduced by defining a maximum injection noise value $s_{max}$ 714 and a minimum injection noise value $s_{min}$ 712 along the biased segment 718, and performing a binary search limited to that area.

Figure 8:
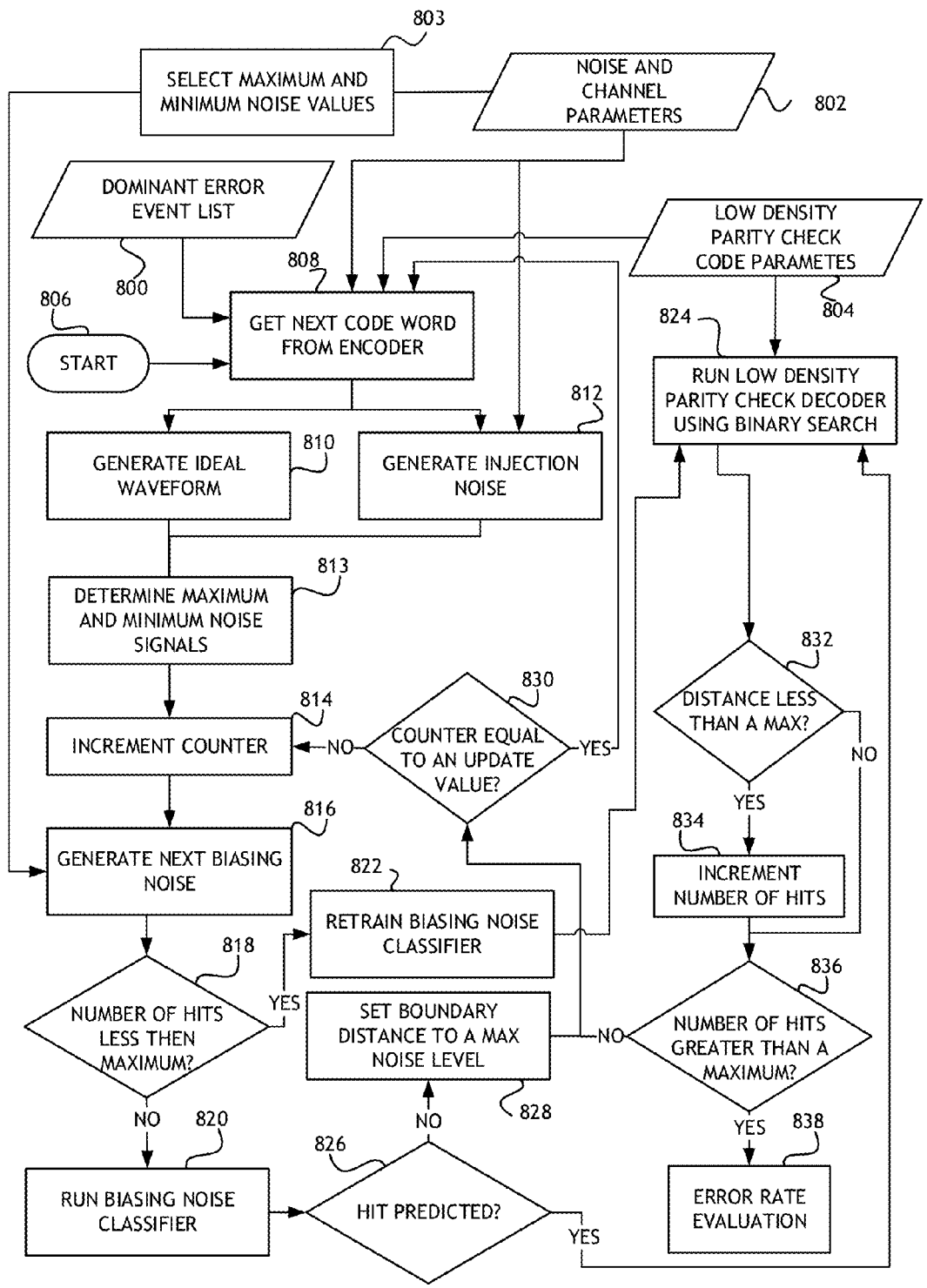
FIG. 8 shows a flowchart of a method for error rate estimation including a biasing noise classifier.

Referring to FIG. 8, a flowchart of a method for error rate estimation including a biasing noise classifier is shown. In at least one embodiment, the method begins 806 by generating 808 a codeword with an encoder. The codeword is generated 808 based on an error event from a dominant error event list 800, noise and channel parameters 802 and low-density parity-check code parameters 804. The codeword is then used to generate 810 an ideal waveform and generate 812 injection noise which are then combined to determine 813 a maximum noise signal $\bar{y}_{max}$ and minimum noise signal $\hat{y}_{min}$. In at least one embodiment, injection noise generation 812 is channel specific and may therefore depend on noise and channel parameters 802. A biasing noise counter is then incremented 814 and a biasing noise generated 816. Biasing noise generation 816 depends on noise and channel parameters 802.

In at least one embodiment of the present invention, a memory block records incidence of error events during simulation, along with corresponding data such as injection noise values and biasing noise. In at least one embodiment, biasing noise classification is performed using any type of pattern recognition technique. Such techniques should allow a classifier to be trained with a set of n-dimensional real vectors.

For example, multivariate analysis based technique that allow controlling two types of a priori error probabilities can be used.

Where the number of recorded hits is less than 818 some maximum, a biasing noise classifier is trained 822 or retrained 822 based on the recorded error events and biasing noise vectors and in some embodiments on recorded correct decodings and corresponding biasing noise vectors. In some embodiments, training 822 or retraining 822 means tuning or modifying existing classification parameters. Training 822 can be performed once after a predetermined quantity of data is accumulated, or can be performed periodically depending on computational resources.

In at least one embodiment, the noise injected codeword is decoded 824 based on low-density parity-check code parameters 804. The noise injection of the noise injected codeword defines a distance from an ideal waveform. During processing, noise injection is iteratively adjusted to define an error boundary. In at least one embodiment of the present invention, noise injection is adjusted according to a binary search algorithm. If the noise injection distance is less 832 than a defined maximum noise value, and decoding 824 indicates an error event, a counter of error events is incremented. In at least one embodiment, the error event and corresponding noise parameters are recorded in a memory block for biasing noise classification training 822.

Whether or not the noise injection distance is less than a defined maximum, the number of error events is compared 836 to a maximum number of error events. If the number of error events is greater than a maximum number of error events, the error rate is evaluated 838 to produce an estimated error rate. If the number of error events is less than a maximum number of error events, and if the number of tests for a particular codeword is less 830 than some defined maximum, the biasing noise counter is incremented 814 and a new biasing noise is generated 816. If, during some iteration, the number of error events is greater 818 than some maximum, a biasing noise classifier can be run 820. If an error event is predicted 826 by the biasing noise classifier, a decoding simulation can be run as described herein to confirm the error event. If an error event is not predicted, the boundary distance is set 828 to a maximum noise value and the number of tests for a particular codeword is compared 830 to a defined maximum, a new codeword is generated and a new iteration of the process begins until error rate evaluation 838 can estimate an error probability for a sufficient set of codewords and error events.

In at least one embodiment, the methodology is biased toward eliminating false error events by simulating decoding for parameters where an error event is predicted 826 but not for parameters where an error event is not predicted 826. Such biasing eliminates costly decoding processing for at least some noise biased codewords. A person skilled in the art may appreciate that other predictive implementations are possible or desirable according to specific circumstances.

It is believed that the present invention and many of its attendant advantages will be understood by the foregoing description of embodiments of the present invention, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for calibrating a low-density parity-check encoder and select a low-density parity check code, comprising:
    decoding one or more low-density parity-check codewords;
    determining at least one noise value likely to cause an error event based on decoding the one or more low-density parity-check codewords;
    determining a first set of parameters comprising a set of Euclidian distances based on the at least one noise value; and
    calibrating a low-density parity-check encoder according to the first set of parameters,
    wherein calibrating the low-density parity-check encoder is configured to focus the encoder on data sets likely to cause error events during simulation.

2. The method of claim 1, further comprising producing an estimated error rate for the low-density parity-check code in a particular channel model.

3. The method of claim 2, wherein producing an estimated error rate comprises adjusting an error rate according to a probability of a random codeword being generated, where each potential codeword is associated with an error probability.

4. The method of claim 1, further comprising:
    associating a first codeword with a first class of codewords according to one or more codeword characteristics; and
    associating a second codeword with a second class of codewords according to one or more codeword characteristics,
    wherein:
        the first class of codewords contains codewords with a substantially similar error probability rate; and
        the second class of codewords contains codewords with a substantially similar error probability rate.

5. The method of claim 4, further comprising:
    selecting a codeword from the first class of codewords; and
    estimating an error rate probability associated with the first class of codewords.

6. The method of claim 4, wherein the one or more codeword characteristics includes at least one of bit pattern equivalence, trapping set (TS) variable equivalence, bit inversion equivalence and central symmetry equivalence.

7. The method of claim 1, further comprising:
    determining one or more dominant error events based on low-density parity-check code parameters; and
    performing importance sampling on the one or more dominant error events.

8. A method for finding a boundary in a low-density parity-check code comprising:
    determining, with a computer, a minimum noise value based on a set of noise channel parameters;
    determining, with a computer, a maximum noise value based on a set of noise channel parameters;
    calculating, with a computer, a minimum noise signal based on the minimum noise value;
    calculating, with a computer, a maximum noise signal based on the maximum noise value;
    determining, with a computer, a test range of noise vectors based on the minimum noise signal and maximum noise signal; and
    performing, with a computer, one or more error rate estimation simulations on signals within the test range, iteratively adjusting a noise level according to a binary search methodology.

9. The method of claim 8, wherein the binary search methodology comprises:

determining, with a computer, that an error event occurs at the maximum noise level; and performing, with a computer, a simulation at a noise level half-way between the maximum noise level and the minimum noise level.

10. The method of claim 8, further comprising:

determining, with a computer, a biasing noise level; and modifying, with a computer, the maximum noise signal and minimum noise signal according to the biasing noise level.

11. The method of claim 10, wherein the biasing noise level is orthogonal to the test range of noise vectors.

12. The method of claim 11, further comprising determining, with a computer, a set of noise values defining an error boundary surface representing a noise level likely to produce an error event for a given noise channel.

13. A data communication system comprising:

a processor;

memory connected to the processor, configured for storing computer executable program code; and computer executable program code, wherein the computer executable program code configures the processor to:

decode one or more low-density parity-check codewords;

determine at least one noise value likely to cause an error event based on decoding the one or more low-density parity-check codewords;

determine a first set of parameters based on the at least one noise value; and calibrate a low-density parity-check encoder according to the first set of parameters.

14. The data communication system of claim 13, wherein the first set of parameters comprises one or more average Euclidian distances.

15. The data communication system of claim 14, wherein the one or more average Euclidian distances are a function of a given error event.

16. The data communication system of claim 13, wherein the computer executable program code is further configured to determine a second set of parameters.

17. The data communication system of claim 16, wherein the computer executable program code is further configured to classify two or more codewords according to at least two estimated error probability rates for a set of conditions.

18. The data communication system of claim 17, wherein the set of conditions comprises a noise value and an error event.

19. The data communication system of claim 18, wherein the second set of parameters comprises at least one estimated probability that a random codeword will belong to a class of codewords.

20. The data communication system of claim 16, wherein the second set of parameters comprises at least one estimated probability that a random codeword will belong to a class of codewords.

* * * * *